United States Patent

Aizawa

[11] Patent Number: 5,985,754
[45] Date of Patent: Nov. 16, 1999

[54] METHOD OF FORMING A VOID-FREE CONTACT PLUG

[75] Inventor: Kazuo Aizawa, Tokyo, Japan

[73] Assignee: NEC Corporation, Tokyo, Japan

[21] Appl. No.: 08/766,028

[22] Filed: Dec. 13, 1996

[30] Foreign Application Priority Data

Feb. 15, 1996 [JP] Japan .................................. 8-028267

[51] Int. Cl.⁶ ..................... H01L 21/203; H01L 21/3205; H01L 21/4763; H01L 23/52
[52] U.S. Cl. ..................... 438/639; 438/643; 438/653; 438/660; 438/688
[58] Field of Search ..................... 438/639, 627, 438/628, 629, 642, 643, 644, 648; 257/774, 763, 752

[56] References Cited

U.S. PATENT DOCUMENTS

| | | | |
|---|---|---|---|
| 5,290,731 | 3/1994 | Sugano et al. | 438/653 |
| 5,356,836 | 10/1994 | Chen et al. | 438/627 |
| 5,371,042 | 12/1994 | Ong | 438/653 |

FOREIGN PATENT DOCUMENTS

| | | |
|---|---|---|
| 0 552 968 | 7/1993 | European Pat. Off. . |
| 0 758 148 | 2/1997 | European Pat. Off. . |
| 4-280425 | 10/1992 | Japan . |
| 5-29251 | 2/1993 | Japan . |
| 6-275555 | 9/1994 | Japan . |

*Primary Examiner*—Olik Chaudhuri
*Assistant Examiner*—Bernard E. Souw
*Attorney, Agent, or Firm*—Young & Thompson

[57] ABSTRACT

In a method of forming a wiring layer, a connection hole is formed to penetrate an insulating film. A barrier metal film is formed at least on an inner wall of the connection hole and a peripheral portion to have surface roughness. Next, a film of the metal including aluminum is deposited on the barrier metal film to fill a portion of the connection hole. Then, while the metal including aluminum is flowed into the connection hole, the film of the metal including aluminum is further deposited to fill the remaining portion of the connection hole with the metal including aluminum. In order to have the surface roughness sufficient to prevent cohesion of particles of metal including aluminum, the barrier metal film may be formed as an immediately lower layer of the metal film at a temperature in a range of room temperature to 150° C. or under a pressure in a range of 10 to 30 mTorr. Alternatively, when the barrier metal film is composed of two films, each of the two films may be formed at a temperature in a range of room temperature to 150° C. As a result, the surface roughness of the barrier metal film is in a range of 10 to 50 nm. As a result, the connection hole can be filled with the metal including aluminum.

21 Claims, 7 Drawing Sheets

METHOD OF FORMING A VOID-FREE CONTACT PLUG

BACKGROUND OF THE INVENTION

1. Field of the Invention

The present invention relates to a method of forming a wiring layer which is applied to the manufacture of the semiconductor device, and more particularly to a method of forming a wiring layer in which a contact hole or via-hole having a large aspect ratio is filled with metal including aluminum.

2. Description of Related Art

The width of a wiring layer becomes thin as a semiconductor circuit has been fabricated to achieve higher density integration. Also, the diameter of the opening of a contact hole or via-hole (to be generally referred to as "a connection hole", hereinafter) is made small. The connection hole is formed in an interlayer insulating film which is interposed between a silicon substrate and the wiring layer, or between an upper wiring layer and a lower wiring layer. As a result, the aspect ratio of the connection hole, i.e., a ratio of the depth of the connection hole to the opening diameter of the connection hole exceeds "1".

Generally, a sputtering method is used to form the wiring layer. However, the sputtering method cannot achieve step coverage sufficient to fill the connection hole which has the high aspect ratio as mentioned above. There is a problem in that a wiring layer is broken at a step. Therefore, as the method of filling the connection hole which has the high aspect ratio, a CVD-W method which has good step coverage is often used at present instead of the sputtering method. However, there is a problem in that this CVD-W method is high in cost and generates cohesion of particles in many positions, compared to the conventional sputtering method.

For this reason, various methods are proposed in which the sputtering method is used which has a good productivity and the step coverage is improved. In these methods, an aluminum (Al) sputtering reflow method is employed in which, after Al is sputtered at a low temperature in a range of the room temperature to about 150° C., a wafer is heated to 450 to 500° C. without breaking the vacuum state to fill the connection hole with the sputtered Al. Alternatively, a high temperature sputtering method is employed in which, after Al is sputtered at a low temperature ⅓ to ½ of a desired film thickness, Al is sputtered for the remaining film thickness while a wafer is heated to 400 to 450° C., such that the connection hole is filled with the sputtered Al.

However, in these methods, the state of the connection hole is greatly dependent on the coverage of Al in the initial stage of the filling process. For example, as shown in FIG. 3, because the coverage of an Al film 2 in the initial stage is wrong when the aspect ratio of a contact hole 1 exceeds "1", there is a problem in that the Al film 2 is broken on the side wall portion of the contact hole 1 when the wafer is heated to high temperature. Also, a void 3 is formed in the contact hole 1, so that the contact hole which is not sufficiently filled with Al is formed.

There are proposed some methods in which the problem that the void is generated in the connection hole can be prevented and the connection hole having the aspect ratio exceeding "1" can be filled with Al.

The first of the these methods is a method of filling with Al alloy which is disclosed in Japanese Laid Open Patent Disclosure (JP-A-Heisei 6-275555). This method will be described with reference to FIGS. 1A to 1C.

First, as shown in FIG. 1A, after a connection hole 6 is formed in an insulating film 5, a titanium (to be referred to as "Ti" hereinafter) film 7 and a titanium nitride (to be referred to as "TiN" hereinafter) film 8 are deposited in the connection hole 6 as a laminate barrier metal film 9 which contains titanium system material. Next, as shown in FIG. 1B, a Ti film 10 is deposited on the laminate barrier metal film 9 by a collimate sputtering method. Subsequently, as shown in FIG. 1C, the connection hole 6 is filled with an Al film 11 in the same vacuum state without breaking the vacuum state using an Al reflow method or a high temperature sputtering method. In this method, wet property with Al is improved by using the TiN film 8 as a lower layer for the film 11 of Al system material. Thus, there is an effect that the cohesion of Al particles in high temperature processing is suppressed.

The second of the above methods is the method of forming a wiring layer which is disclosed in Japanese Laid Open Patent Disclosure (JP-A-Heisei 4-280425). This method will be described with reference to FIGS. 2A to 2D. First, as shown in FIG. 2A, after a connection hole 6 is formed in an insulating film 5 to extend a diffusion layer, a Ti film 13 is deposited in the connection hole 6 as the first layer barrier metal film. Next, as shown in FIG. 2B, a TiON film 14 is deposited on the Ti film 13 by a bias sputtering method as second layer barrier metal film. Alternatively, after the TiON film 14 is formed by a usual sputtering method, laser anneal is performed. The TiON film 14 formed on Ti crystal grains 15 in this way is composed of TiON crystal grains 16 each of which has a large crystal grain size and a flat surface, as shown in FIG. 2D. Subsequently, as shown in FIG. 2C, the upper portion of the connection hole 6 is filled with an Al film 17 using a high temperature sputtering method. This method has an effect that the TiON film 14 is formed as the barrier metal to have the flat surface, so that a wet property of the TiON film with the Al film is improved and the fluidity of Al is improved.

The third of the above methods is disclosed in Japanese Laid Open Patent Disclosure (JP-A-Heisei 5-29251). In this method, after a connection hole is formed, a TiW or TiN film is formed. When the connection hole is filled with Al at a high temperature, the filling is performed while the contact hole is vibrated with supersonic wave of 1 MHz under high pressure of about 10 Torr. The method has an effect that the fluidity of Al is improved by the high pressure and the supersonic wave.

However, in the above-mentioned conventional methods, there are some problems for the purpose that the connection hole having, especially, an aspect ratio exceeding "1" is stably filled.

In the first method, the process of forming the Ti film as a lower layer for the Al system material film and the process of filling the connection hole with Al must be performed in the same vacuum state without breaking the vacuum state. Therefore, the process of sputtering Ti must be added before the process of filling the connection hole with Al. For this reason, the number of wafers processed per a unit time in the sputtering step (the throughput) reduces. Further, because a Ti collimate sputtering method is used, there is a problem in that the productivity is decreased. In addition, the use of the collimate boards directs the generation of particles. Also, because alloy such as $Al_3Ti$ is formed from Ti and Al system materials at a high temperature, there is a problem that the contact/via resistance and wiring resistance increase when this alloy exists in the manner of islands.

In the second method, in a case of the connection hole having the aspect ratio of 1 or below, because the Al film can have sufficient coverage on the side wall of the connection hole and the barrier metal is smooth, it is possible that Al flows to fill the connection hole. However, in a case of the connection hole having the aspect ratio of 1 or above, because the Al film has wrong coverage on the side wall of the connection hole and the surface of the barrier metal is smooth when the Al film is heated to a high temperature, Al particles cohere so that the Al film is broken on the step of the side wall portion. As a result, there is a problem in that Al can not flow into the connection hole such that voids are formed in the connection hole.

In the third method, because the high pressure and the supersonic wave are used for filling the connection hole with Al, there is a problem in that a special unit is required which is different from the conventional sputtering apparatus and the productivity is low.

SUMMARY OF THE INVENTION

The present invention is made to solve the above problems and has as an object to provide a method of forming a wiring layer in which a connection hole can be stably filled with Al system material with good productivity even if the connection hole has an aspect ratio exceeding "1".

In order to achieve an aspect of the present invention, a method of forming a wiring layer includes the steps of:

forming a connection hole to penetrate an insulating film;

forming a barrier metal film at least on an inner wall of the connection hole and a peripheral portion to have surface roughness sufficient to prevent cohesion of particles of metal including aluminum;

performing a first deposition of a film of the metal including aluminum on the barrier metal film to fill a portion of the connection hole;

flowing the deposited metal including aluminum into the connection hole; and performing a second deposition of the film of the metal including aluminum to fill the remaining portion of the connection hole with the metal including aluminum.

When the barrier metal film is composed a first film and a second film on the first film, the second film is formed as an immediately lower layer of the metal film at a temperature in a range of room temperature to 150° C. The second film may be formed under a pressure in a range of 10 to 30 mTorr. Alternatively, each of the first and second films may be formed at a temperature in a range of room temperature to 150° C. As a result, the surface roughness of the barrier metal film is in a range of 10 to 50 nm.

The step of flowing the deposited metal including aluminum and the step of performing a second deposition may be executed at the same time. In this case, the portion of the connection hole is ⅓ to ½ of a desired thickness of the film of the metal including aluminum. The remaining portion of the connection hole is filled with a sputtering rate of 1/10 of that in the step of performing a first deposition while performing the flowing step.

In order to achieve another aspect of the present invention, a method of forming a wiring layer includes the steps of:

forming a connection hole to penetrate an insulating film;

forming a barrier metal film at least on an inner wall of the connection hole and a peripheral portion to have surface roughness of 10 to 50 nm;

performing a first deposition of a film of metal including aluminum on the barrier metal film to fill a portion of the connection hole;

flowing the deposited metal including aluminum into the connection hole; and performing a second deposition of the metal film including aluminum to fill the remaining portion of the connection hole with the metal including aluminum.

In order to achieve still another aspect of the present invention, a method of forming a wiring layer includes the steps of:

forming a connection hole having an aspect ratio exceeding 1 to penetrate an insulating film;

forming a barrier metal film at least on an inner wall of the connection hole and a peripheral portion by a sputtering method to have surface roughness sufficient to prevent cohesion of particles of metal including aluminum;

performing a first deposition of a film of the metal including aluminum on the barrier metal film by a sputtering method to fill a portion of the connection hole;

flowing the deposited metal including aluminum into the connection hole at a temperature of 400 to 450° C.; and performing a second deposition of the film of the metal including aluminum by a sputtering method to fill the remaining portion of the connection hole with the metal including aluminum.

The file of this patent contains at least one drawing executed in color. Copies of this patent with color drawings will be provided by the Patent and Trademark Office upon request and payment of the necessary fee.

DESCRIPTION OF THE PREFERRED EMBODIMENTS

The method of forming a wiring layer of the present invention will be described below in detail with reference to the accompanying drawings.

FIGS. 4A to 4E illustrate the method of forming a wiring layer according to the first embodiment of the present invention. The method of forming a wiring layer in this embodiment is an example in which the sputtering of TiN is performed in a low temperature in the process of forming a barrier metal film of a TiN/Ti as a lower film of an Al system material film such that the surface roughness of a TiN film is increased.

Figure 1A:
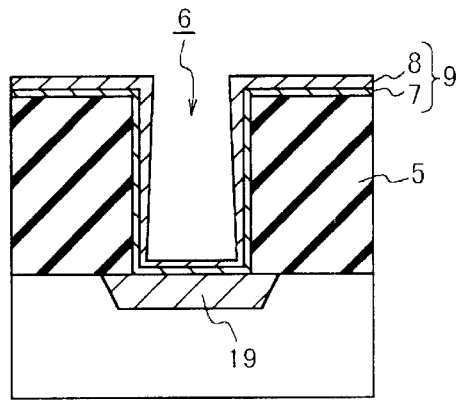
FIGS. 1A to 1C are process flow diagrams illustrating an example of a conventional method of forming a wiring layer in a process order.
Figure 1B:
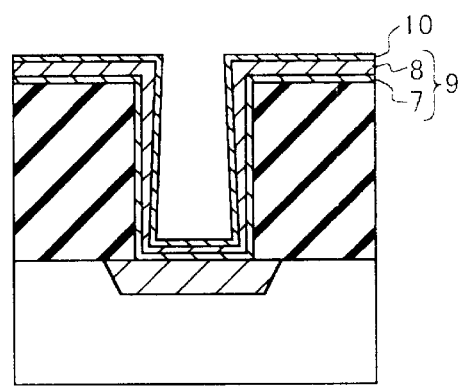
Figure 1C:
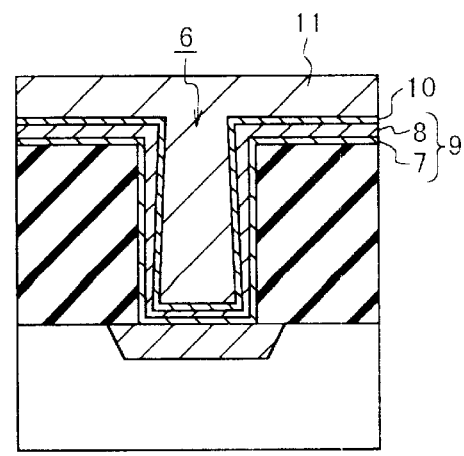
Figure 2A:
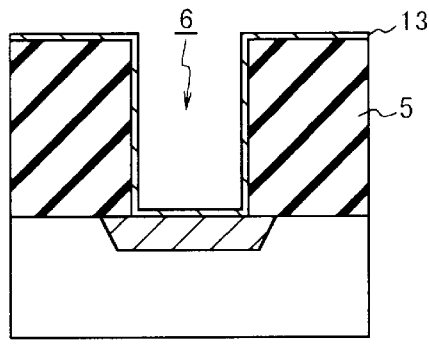
FIGS. 2A to 2D are process flow diagrams illustrating an example of another conventional method of forming a wiring layer.
Figure 2B:
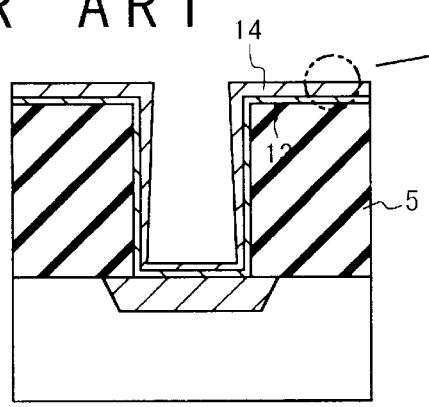
Figure 2D:
Figure 2C:
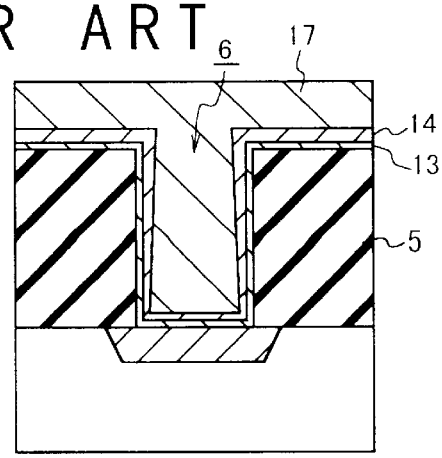
Figure 3:
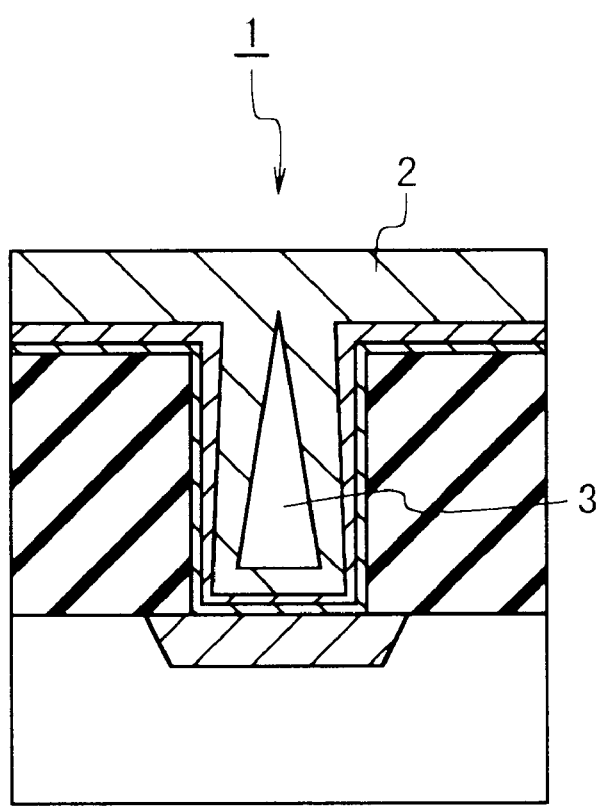
FIG. 3 is a diagram illustrating an example of defect in a case of the conventional method of forming a wiring layer.
Figure 4A:
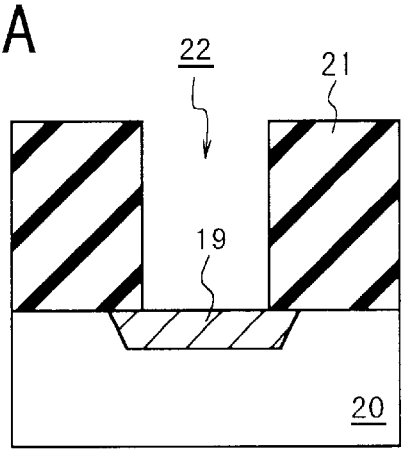
FIGS. 4A to 4E are process flow diagrams illustrating the processes in a method of forming a wiring layer according to an embodiment of the present invention.

First, as shown in FIG. 4A, an insulating film 21 which is composed of a silicon oxide film ($SiO_2$) as a main component is formed on a Si substrate 20 on whose surface a diffusion layer 19 has been formed. The insulating film 21 is patterned by a well known method to form a contact hole 22 (a connection hole) with an aspect ratio of "1.5".

Figure 4B:
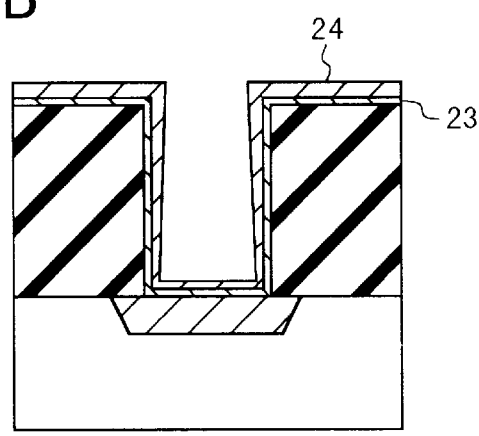

Next, as shown in FIG. 4B, a Ti film 23 having the film thickness of 60 nm and a TiN film 24 having the film thickness of 100 nm are sequentially deposited by a sputtering method and a reactive sputtering method to function as a contact layer and an Al diffusion barrier layer, respectively. In a case that the TiN film 24 is formed by the reactive sputtering method, a sputtering temperature is set to a condition of a low temperature in a range of the room temperature to 150° C.

Figure 5:
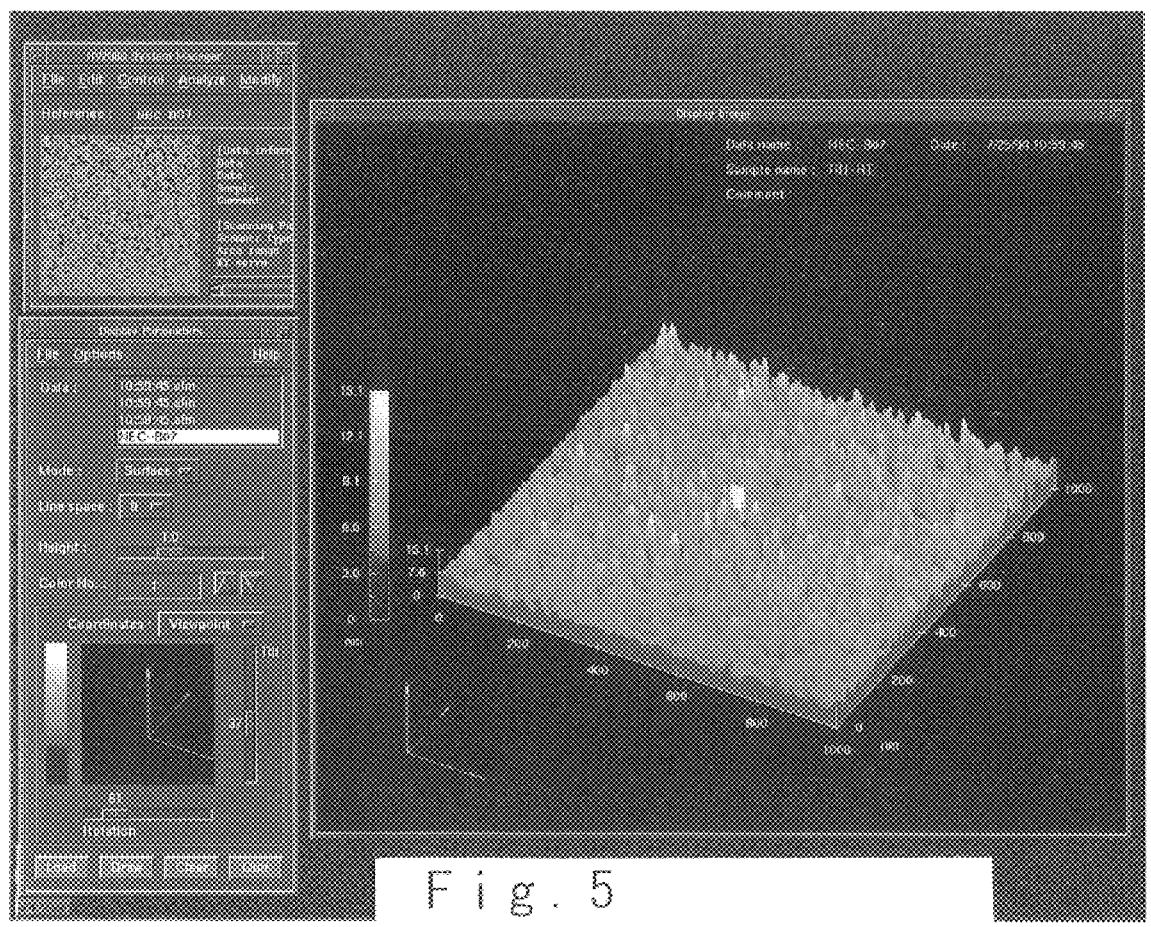
FIG. 5 is a diagram illustrating the measuring result of the surface roughness of a TiN film which is formed under the condition of the above-mentioned embodiment using an atomic force microscope (AFM)
Figure 6:
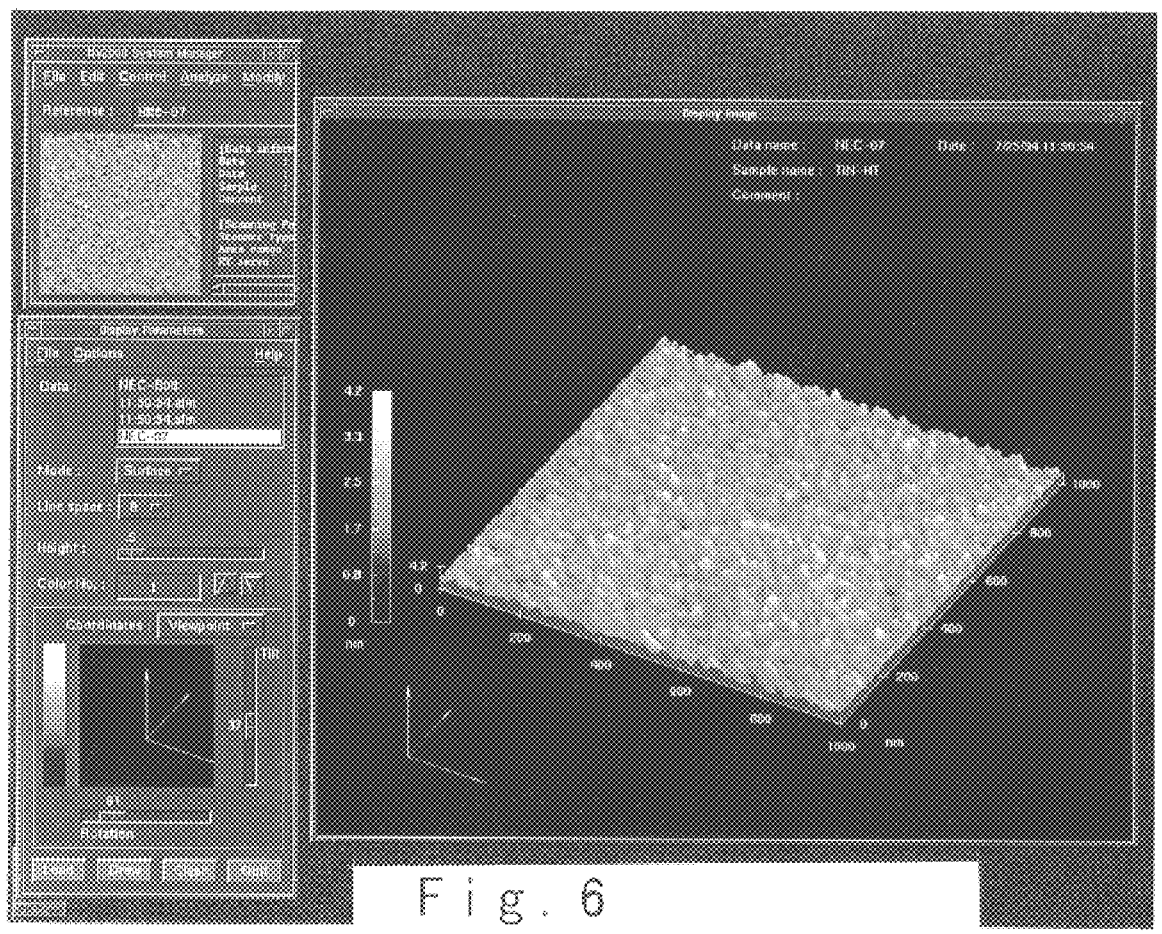
FIG. 6 is a diagram illustrating the measuring result of the surface roughness of a TiN film which is formed by a conventional method using the atomic force microscope.

The measuring result of the surface roughness of the TiN film 24 which has been formed in this condition, using an atomic force microscope (AFM) is shown in FIG. 5. As a comparison example, the measuring result of the surface roughness of a TiN film which is formed by a conventional method (the sputtering temperature is 350° C.), using the AFM is shown in FIG. 6. Referring to FIG. 5, it could be seen that the surface roughness of the TiN film which has been formed at a low temperature in accordance with this embodiment has a lot of protruding portions and recess portions formed on the surface. The unevenness is desirable to be in a range of 10 nm to 50 nm. In the measuring result, the unevenness is about 15-nm height. On the other hand, referring to FIG. 6, there is only surface unevenness of about 3-nm height on the surface of the TiN film which has been formed by the conventional method. It could be seen that it is very smooth compared to the present embodiment. Further, grains are rounded and there is no protruding portions and recess portions unlike FIG. 5. In this manner, it was confirmed that the surface roughness of the TiN film 24 formed at a low temperature in accordance with the present embodiment became large.

Figure 4C:
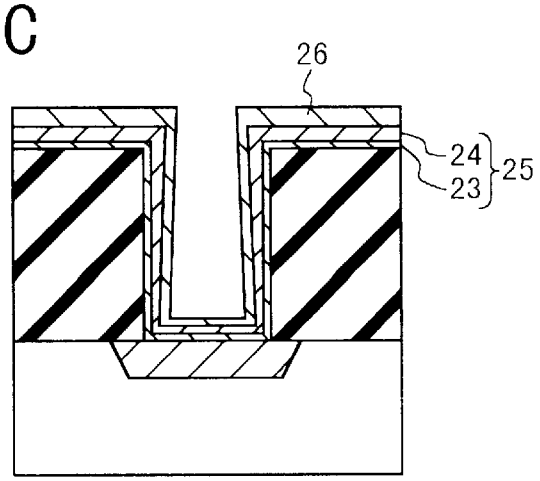

After the laminate layer barrier metal film 25 composed of the Ti film 23 and the TiN film 24 is formed by the above-mentioned method, a wafer is once located in the atmosphere and next the process of filling the connection hole with Al is performed. As shown in FIG. 4C, an Al alloy film such as an AlSiCu film 26 is formed as a wiring layer at a low temperature in a range of the room temperature to 150° C. using a sputtering method to have the thickness of 200 to 300 nm. In this case, the film thickness of the AlSiCu film 26 is set to be about ⅓ to ½ of the final film thickness.

Figure 4D:
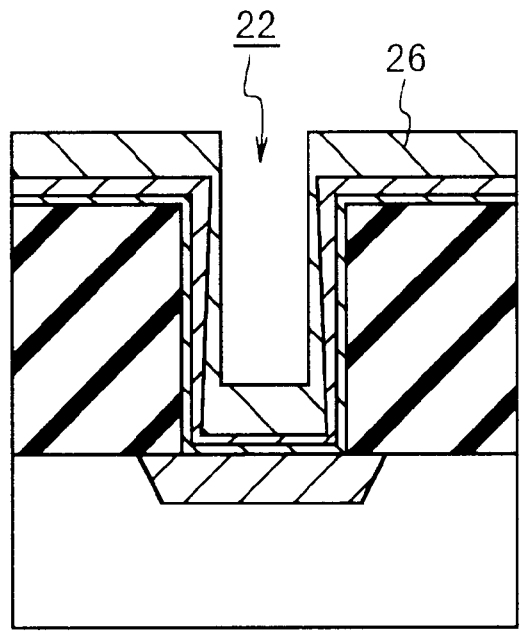
Figure 4E:
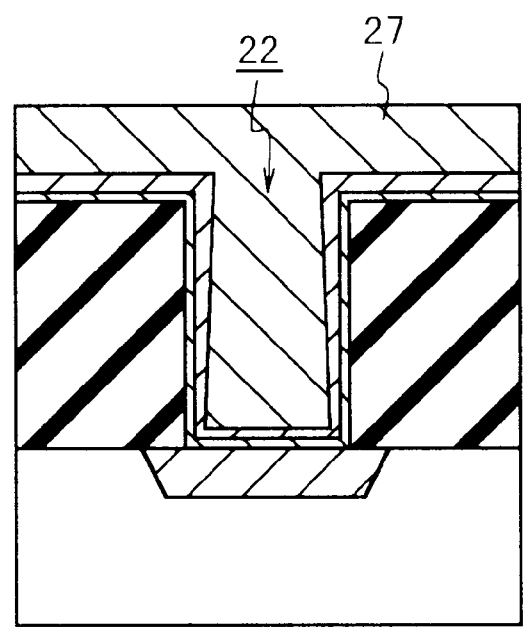

Thereafter, the wafer is conveyed to another sputtering chamber in the same vacuum state without breaking the vacuum state. The wafer is put on the stage which is heated such that the substrate temperature is 400 to 450° C. As shown in FIG. 4D, the AlSiCu film 26 is made to be flowed in the contact hole 22. Also, a new AlSiCu film 26 is deposited by the sputtering method for the film thickness of a remaining portion. In this case, the sputtering rate is made late to about ¹⁄₁₀ of a normal rate mentioned above and the AlSiCu film 27 is formed while the contact hole 22 is sufficiently filled with AlSiCu. The process of flowing the AlSiCu film 26 and the process of sputtering AlSiCu may be performed at the same time or the latter may be performed after the former. When the sputtering completes, the contact hole 22 which is filled with the AlSiCu film 27 is formed as shown in FIG. 4E.

In this manner, in the first embodiment, the roughness of the surface layer of the barrier metal as a lower layer is increased for an Al system alloy film as a wiring layer. For example, when the laminate film of Ti and TiN is used as the barrier metal, the TiN film on the upper layer side is required to increase the surface roughness. By increasing the surface roughness of the TiN film, the sputtered Al particles adhere onto the TiN film with good wet property. Here, the good wet property means that a contact angle is small between the sputtered Al particles. If the Al particles adhered in this way are heated to high temperature, cohesion of the Al particles on the TiN film is restrained because the surface roughness of the TiN film is large. For this reason, because a thin film of Al particles which have been adhered on the side wall of the connection hole is present as a continuous film without cohesion of Al particles, the connection hole 22 can be filled with Al through surface diffusion. Also, the increase of the surface roughness of the TiN film is achieved during the sputtering process of TiN. Therefore, an additional process needs not to be required in the following process of filling the connection hole with Al.

According to the method of forming a wiring layer according to the first embodiment, because the TiN film 24 is formed at low temperature, it is difficult for crystal grain to grow so that the surface roughness of the TiN film 24 becomes large. Therefore, the sputtered Al particles have good wet property to adhere onto the TiN film 24. Thereafter, In a case where the wafer is heated to a high temperature, the cohesion of Al particles on the TiN film 24 is restrained because the surface roughness of the TiN film 24 is large. Therefore, because Al particles can exist to form a continuous film on the side wall of the contact hole 22 without any cohesion, the AlSiCu film 26 can sufficiently fill the inside of the contact hole 22 by surface diffusion even if the contact hole 22 has a large aspect ratio. As a result, the wiring layer can be formed with high reliability without any void.

Also, in order to make the surface roughness of the TiN film 24 large, the temperature in the sputtering of TiN is sufficient to be set to a temperature lower than the conventional method. Therefore, it is not necessary to add an additional process to the following process of filling the connection hole with Al and a special equipment is not required. The high productivity can be achieved.

Next, the method of forming a wiring layer according to the second embodiment of the present invention will be described. The method of forming a wiring layer in the second embodiment is almost the same as that of the first embodiment and is different from the first embodiment only in that the increase of the surface roughness of the TiN film. Therefore, only the increase of the surface roughness will be described and the description of the common process will be omitted.

The increase of the surface roughness of the TiN film in second embodiment is achieved by sputtering TiN at high pressure. Generally, the sputtering of TiN is performed at the pressure of about 2 to 3 mTorr. In case of the second embodiment, however, the sputtering of TiN for forming the barrier metal of a TiN/Ti system is performed at a pressure of 10 mTorr to 30 mTorr. If the sputtering is performed at the pressure of 10 mTorr to 30 mTorr, Ar (argon) or nitrogen gas which exists in a chamber prevents the growth of TiN crystal grain. As a result, the grain size is small and the TiN film having the large surface unevenness is formed as in the example shown in FIG. 5.

Next, the method of forming a wiring layer according to the third embodiment of the present invention will be described. The method of forming wiring in the third embodiment is also almost the same as that of the first embodiment and different from the first embodiment only in the increase of the surface roughness of a TiN film.

Therefore, only the increase of the surface roughness will be described and the description of the common process will be omitted.

In the increasing process of the TiN film surface roughness in the third embodiment, both of the TiN sputtering and the Ti sputtering is performed at a low temperature. Only TiN of TiN/Ti is sputtered at a low temperature in the first embodiment. In the third embodiment, however, both of TiN and Ti are sputtered at a low temperature of the room temperature to 150° C. More particularly, first, the Ti film having the film thickness of 60 nm is formed by a sputtering method at a low temperature of the room temperature to 150° C. Because the Ti crystal grain is difficult to become large in the Ti film formed at the low temperature, the surface roughness increases. Especially, the increase of this surface roughness is remarkable in the opening portion and side wall portion of the contact hole.

Next, the TiN film having the thickness of 50 to 100 nm is formed in the same way by the sputtering method at a low temperature of the room temperature to 150° C. As described in the first embodiment, the surface roughness of the TiN film itself increases by sputtering at the low temperature. In case of the third embodiment, however, because the surface roughness of the Ti film as a lower layer of the TIN film has been increased, the surface roughness of the TiN film further becomes large, reflecting the surface roughness of the Ti film of the lower layer, compared to the case where the surface roughness of the TiN film has been made large independently. Especially, because the roughness increases on the side wall portion of the contact hole is increased, the cohesion restraint effect against Al is becomes great when the wafer is heated.

In this manner, in both the second and third embodiments, the surface roughness of the TiN film can be increased only by the control of the temperature and pressure in the sputtering. Therefore, the same effects as in the first embodiment can be obtained in which the contact hole having a large aspect ratio can be sufficiently filled with Al and also the high productivity can be provided.

The technical scope of the present invention is not limited to the above embodiments. Various modifications can be applied without depart from the scope of the present invention. For example, the high temperature sputtering method of Al is used in the process of filling the connection hole with Al in the above embodiments. In this case, the same effect can be also obtained even if an Al reflow method is used. Also, AlSiCu is used as Al alloy for the barrier film. However, the same effect can be obtained even if AlCu, the other Al alloy or metal including Al is used. Further, an example that the connection hole is a contact hole is described in the above embodiments. However, the present invention can be applied to a via-hole which provided between an upper wiring layer and a lower wiring layer wiring.

As described above in detail, according to the method of forming a wiring layer of the present invention, the surface roughness of the barrier metal surface layer portion is made large so that sputtered particles of Al adhere onto the barrier metal with a good wet property. After that, even if it is heated to a high temperature, the cohesion of the Al particles on the barrier metal is restrained. Therefore, because Al exists on the side wall of the connection hole to form a continuous film without cohesion, the connection hole with a large aspect ratio can be filled sufficiently with Al through surface diffusion. As a result, the wiring layer having no void and so on can be formed with high reliability. Also, since the increasing process of the surface roughness of the barrier metal is adopted in the sputtering process, any additional process needs not to be provided in the following Al filling process and a special apparatus is also required. Therefore, high productivity can be secured.

What is claimed is:

1. A method of forming a wiring layer comprising the steps of:

forming a connection hole to penetrate an insulating film;

forming a barrier metal film at least on an inner wall of said connection hole and a peripheral portion to have surface roughness sufficient to prevent cohesion of particles of metal including aluminum;

performing a first deposition of a film of said metal including aluminum on said barrier metal film to fill a portion of said connection hole;

flowing said deposited metal including aluminum into said connection hole; and performing a second deposition of said film of said metal including aluminum to fill the remaining portion of said connection hole with said metal including aluminum.

2. A method of forming a wiring layer according to claim 1, wherein a barrier metal film is composed a first film and a second film on said first film, and wherein said step of forming a barrier metal film includes forming said second film at a temperature in a range of room temperature to 150° C.

3. A method of forming a wiring layer according to claim 1, wherein a barrier metal film is composed a first film and a second film on said first film, and wherein said step of forming a barrier metal film includes forming said second film under a pressure in a range of 10 to 30 mTorr.

4. A method of forming a wiring layer according to claim 1, wherein a barrier metal film is composed a first film and a second film on said first film, and wherein said step of forming a barrier metal film includes forming each of said first and second films at a temperature in a range of room temperature to 150° C.

5. A method of forming a wiring layer according to claim 1, wherein said surface roughness of said barrier metal film is in a range of 10 to 50 nm.

6. A method of forming a wiring layer according to claim 1, wherein said step of flowing said deposited metal including aluminum and said step of performing a second deposition are executed at the same time.

7. A method of forming a wiring layer according to claim 1, wherein both of said step of performing a first deposition and said step of performing a second deposition are executed by a sputtering method.

8. A method of forming a wiring layer according to claim 1, wherein said portion of said connection hole is ⅓ to ½ of a desired thickness of said film of said metal including aluminum.

9. A method of forming a wiring layer according to claim 8, wherein said step of performing a second deposition is performed with a sputtering rate of ¹⁄₁₀ of that in said step of performing a first deposition while performing said flowing step.

10. A method of forming a wiring layer comprising the steps of:

forming a connection hole to penetrate an insulating film;

forming a barrier metal film at least on an inner wall of said connection hole and a peripheral portion to have surface roughness of 10 to 50 nm;

performing a first deposition of a film of metal including aluminum on said barrier metal film to fill a portion of said connection hole;

flowing said deposited metal including aluminum into said connection hole; and performing a second deposition of said metal film including aluminum to fill the remaining portion of said connection hole with said metal including aluminum.

11. A method of forming a wiring layer according to claim 10, wherein a barrier metal film is composed a first film and a second film on said first film, and wherein said step of forming a barrier metal film includes forming said second film at a temperature in a range of room temperature to 150° C.

12. A method of forming a wiring layer according to claim 10, wherein a barrier metal film is composed a first film and a second film on said first film, and wherein said step of forming a barrier metal film includes forming said second film under a pressure in a range of 10 to 30 mTorr.

13. A method of forming a wiring layer according to claim 10, wherein a barrier metal film is composed a first film and a second film on said first film, and wherein said step of forming a barrier metal film includes forming each of said first and second films at a temperature in a range of room temperature to 150° C.

14. A method of forming a wiring layer according to claim 10, wherein said step of flowing said deposited metal including aluminum and said step of performing a second deposition are executed at the same time.

15. A method of forming a wiring layer according to claim 10, wherein said portion of said connection hole is 1/3 to 1/2 of a desired thickness of said film of said metal including aluminum.

16. A method of forming a wiring layer according to claim 15, wherein said step of performing a second deposition is performed with a sputtering rate of 1/10 of that in said step of performing a first deposition while performing said flowing step.

17. A method of forming a wiring layer comprising the steps of:

forming a connection hole having an aspect ratio exceeding 1 to penetrate an insulating film;

forming a barrier metal film at least on an inner wall of said connection hole and a peripheral portion by a sputtering method to have surface roughness sufficient to prevent cohesion of particles of metal including aluminum;

performing a first deposition of a film of said metal including aluminum on said barrier metal film by a sputtering method to fill a portion of said connection hole;

flowing said deposited metal including aluminum into said connection hole at a temperature of 400 to 450° C.; and performing a second deposition of said film of said metal including aluminum by a sputtering method to fill the remaining portion of said connection hole with said metal including aluminum.

18. A method of forming a wiring layer according to claim 17, wherein said step of flowing said deposited metal including aluminum and said step of performing a second deposition are executed at the same time.

19. A method of forming a wiring layer according to claim 17, wherein a barrier metal film is composed a first film and a second film on said first film, and wherein said step of forming a barrier metal film includes forming said second film at a temperature in a range of room temperature to 150° C.

20. A method of forming a wiring layer according to claim 17, wherein a barrier metal film is composed a first film and a second film on said first film, and wherein said step of forming a barrier metal film includes forming said second film under a pressure in a range of 10 to 30 mTorr.

21. A method of forming a wiring layer according to claim 17, wherein a barrier metal film is composed a first film and a second film on said first film, and wherein said step of forming a barrier metal film includes forming each of said first and second films at a temperature in a range of room temperature to 150° C.

* * * * *